(12) United States Patent
Kajita

(10) Patent No.: US 7,215,001 B2
(45) Date of Patent: May 8, 2007

(54) SEMICONDUCTOR DEVICE AND METHOD OF MANUFACTURING THE SAME

(75) Inventor: Akihiro Kajita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 10/835,594

(22) Filed: Apr. 30, 2004

(65) Prior Publication Data

US 2005/0179062 A1   Aug. 18, 2005

(30) Foreign Application Priority Data

Feb. 12, 2004  (JP) .............................. 2004-035403

(51) Int. Cl.
*H01L 21/82*  (2006.01)
*H01L 27/10*  (2006.01)
*H01L 29/00*  (2006.01)

(52) U.S. Cl. ...................... 257/529; 257/209
(58) Field of Classification Search ............... None
See application file for complete search history.

(56) References Cited

U.S. PATENT DOCUMENTS

| | | | | |
|---|---|---|---|---|
| 5,068,706 A * | 11/1991 | Sugita et al. | ............... | 257/665 |
| 6,252,292 B1 * | 6/2001 | Brintzinger et al. | ........ | 257/529 |
| 6,295,721 B1 * | 10/2001 | Tsai | ............................. | 29/623 |
| 6,373,371 B1 * | 4/2002 | Doerrwaechter et al. | ... | 337/297 |
| 6,413,620 B1 * | 7/2002 | Kimura et al. | .............. | 428/210 |
| 6,750,129 B2 * | 6/2004 | Yang et al. | ................. | 438/601 |
| 6,864,124 B2 * | 3/2005 | Lee et al. | .................... | 438/132 |
| 2002/0140532 A1 * | 10/2002 | Koriyama | ................... | 333/239 |
| 2002/0171119 A1 * | 11/2002 | Sasaki | ........................ | 257/529 |

* cited by examiner

*Primary Examiner*—Johannes Mondt
(74) *Attorney, Agent, or Firm*—Foley & Lardner LLP

(57) ABSTRACT

A semiconductor device capable of controlling an operation of a fuse element by increasing a resistance of the fuse element without fusing the fuse wiring by the laser beam irradiation comprises a semiconductor substrate, a first wiring formed above the semiconductor substrate, a second wiring formed above the first wiring, at least one plug which acts as a fuse element to connect the first wiring and the second wiring, and an opening made in a part of an insulator formed above the second wiring so as to correspond to the plug.

14 Claims, 5 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2004-035403, filed Feb. 12, 2004, the entire contents of which are incorporated herein by reference.

BACKGROUND OF THE INVENTION

1. Field of the Invention

This invention relates to a semiconductor device including a fuse element, and more particularly to a semiconductor device with a structure to control the operation of the fuse element by a laser beam irradiation.

2. Description of the Related Art

A large-scale semiconductor memory device, such as a DRAM and a flash memory, or a high-performance semiconductor logic device embedded these devices thereon generally uses a redundancy circuit as means for remedying a circuit with a faulty element. One known method of using or not using the redundancy circuit is to fuse a metal wiring acting as a fuse element provided in a specific part of multilevel wiring by means of, for example, a laser beam irradiation.

A large-scale, high-performance semiconductor device, such as a high-performance logic device or a DRAM device, is required to operate at high speed. Therefore, to achieve a higher speed operation, it is desirable that the delay in the transmission of signals in the multilevel wiring is decreased. Therefore, favorable materials for the multilevel wiring include a metal with a lower resistance than aluminum (Al), such as copper (Cu), and an insulator with a lower permittivity (so-called low-k insulator) than silicon oxide film as an inter-wiring insulator or an interlevel insulator, such as a fluorine-added silicon oxide, methyl-polysiloxane (MSX), hydrogen-silsesquioxane (HSQ), or poly (arylene) ether (PAE). Since these low-permittivity insulators generally have poorer thermal characteristics than that of a silicon oxide, various problems arise when the fuse elements are fused by the laser beam irradiation.

FIGS. 11 and 12 are sectional views of multilevel wiring structures in the prior art. FIG. 11 shows a structure of a multilevel wiring with four levels which, has a fuse element 340F, formed on a silicon substrate 310. A fuse wiring 345F in the fuse element 340F is fused off by a laser beam LB irradiation. A fuse wiring 345F is provided in a part of a fourth-level metal wiring 345, the top level, and connects a memory circuit to a redundancy circuit. In insulators 348, 349 above the fuse wiring 345F, an opening 350F for a laser beam irradiation is made. Here, Cu is used as a metal material for the wirings 315, 325, 335, and 345 and a low-permittivity insulator is used as the interlevel insulators 311, 321, 331, and 341. Therefore, a material for the fuse wiring 345F is also Cu. Use or nonuse of the redundancy circuit is controlled, depending on whether the fuse wiring 345F is fused off or not.

Comparison between the melting points of the wiring metals has shown that Cu has a melting point as high as 1083° C., whereas Al used in the prior art has a melting point of 660° C. Therefore, to fuse Cu, a laser beam with higher energy than that needed to fuse Al has to be irradiated. The low-permittivity interlevel insulator 341 in contact with the fuse wiring 345F has lower heat resistance than that of a silicon oxide used in the prior art. Therefore, when the Cu fuse wiring is fused by the laser beam irradiation, various problems arise as described below.

The fuse element 340F has a structure shown in FIG. 11 and uses Cu as a fuse wiring material and a low-permittivity insulator as the interlevel insulators 311, 321, 331 and 341. Typical problems encountered when the Cu fuse wiring 345F is fused by the laser beam LB irradiation are shown in FIG. 12. Since the melting point of Cu is higher than that of Al as described above, it is necessary to irradiate with a high-energy laser beam LB to heat the Cu fuse wiring 345F to a high temperature and fuse it. This causes problems: (A) the insulator 341 around the fuse wiring deteriorates due to the resulting heat, which leads to a short or an open in the circuit. In addition, with the thermal stress developed at this time, (B) the Cu wiring 345 is deformed, (C) a separation takes place between the Cu wiring 345 and the overlying passivation films 348, 349, or (D) cracks are generated in the passivation films 348, 349. Furthermore, since the mechanical strength of the interlevel insulator 341 in contact with the Cu fuse wiring 345F is low, (E) a crack might be generated in the interlevel insulator 341 just below the fuse wiring 345F and (F) a crack might be generated in the insulator 341 between the fuse wiring 345F and the Cu wirings 345 in the same level. When a crack has generated in the insulator or the passivation film has come off, moisture and oxygen in the air reach the Cu wiring through the crack, which causes the problem of a reliability degradation of the Cu wiring.

Furthermore, since the diffusion of Cu in the insulator is faster than that of Al and the diffusion of Cu in the low-permittivity insulator is faster than in the silicon oxide film, Cu diffuses into the insulator 341 around the fuse element 340F, or in an extreme case, (G) a Cu penetration is formed in the insulator 341. As a result of the diffusion or penetration of Cu into the insulator, the problem of an unintended short circuit or reliability degradation occurs. In addition, the Cu in the fused part does not evaporate completely, but (H) most of the Cu scatters in and around the laser beam irradiation opening 350F. The scattered Cu particles also cause the problem of a reliability degradation of the semiconductor device.

It is, accordingly, an object of the present invention to provide a semiconductor device capable of controlling an operation of a fuse element without fusing the fuse wiring by the laser beam irradiation and a method of manufacturing the semiconductor device.

BRIEF SUMMARY OF THE INVENTION

According to an aspect of the present invention, a semiconductor device comprises a semiconductor substrate, a first wiring formed above the semi-conductor substrate, a second wiring formed above the first wiring, at least one plug which acts as a fuse element to connect the first wiring and the second wiring, and an opening made in a part of an insulator formed above the second wiring so as to correspond to the plug.

In another aspect, a method of manufacturing a semiconductor device comprises forming a first wiring above a semiconductor substrate, depositing a first insulator on the first wiring, making a contact hole to connect the first wiring and a second wiring to be formed above the first wiring and a groove for the second wiring in the first insulator, forming a plug as a fuse element in the contact hole and the second wiring in the groove for the second wiring, forming a second insulator on the second wiring, making an opening in a part of the second insulator in such a manner that the opening corresponds to the plug, and irradiating a laser beam onto the opening to make a void in at least one of the plugs.

DETAILED DESCRIPTION OF THE INVENTION

Figure 1:
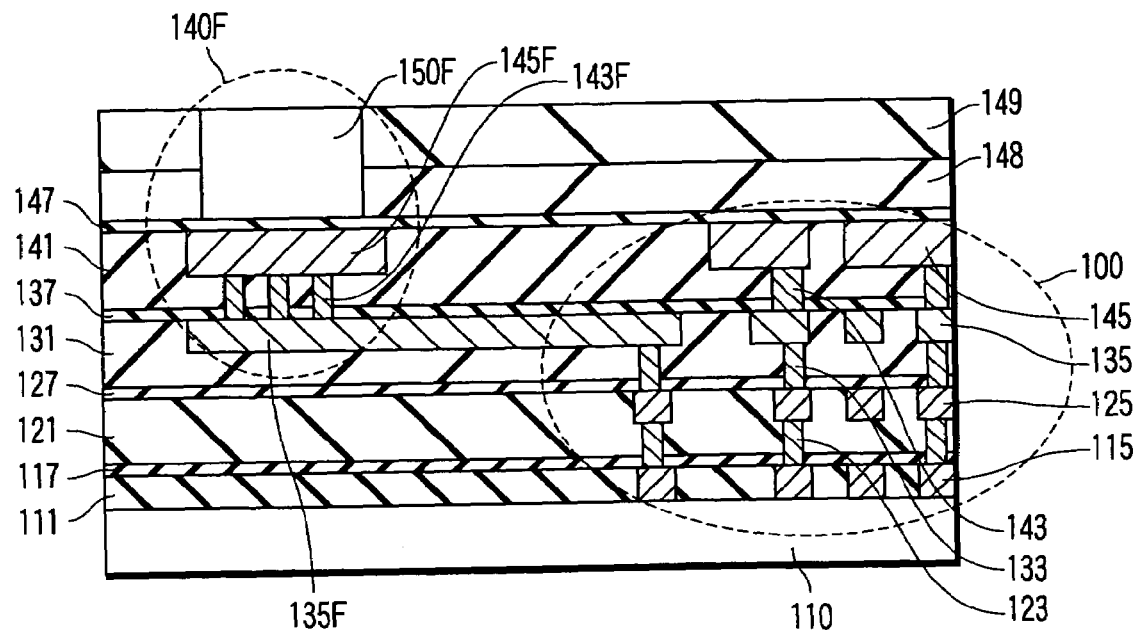
FIG. 1 is a sectional view of a semiconductor device according to a first embodiment of the present invention, particularly a sectional view of a fuse element without a void.

Referring to the accompanying drawings, embodiments of the present invention will be explained in detail below. In the drawings, like parts are indicated by corresponding reference numerals.

First Embodiment

FIG. 1 is a sectional view of an example of the structure of a semiconductor device according to a first embodiment of the present invention. FIG. 1 mainly shows a portion related to a fuse element 140F formed in a part of a multilevel wiring 100 directly associated with the present invention. Therefore, although, for example, isolations, MOSFETs, and others are formed on a semiconductor (e.g., silicon) substrate 110 on which a multilevel wiring is actually formed, these structures are omitted for simplification but are regarded as being included in the silicon substrate 110.

A fuse element 140F structure of the first embodiment is characterized by having two different elements in a fuse via plug 143F acting as a fuse element, i.e. a fuse element 140 V with a void 143V (see FIG. 2) and a fuse element 140F without a void (see FIG. 1). The fuse element 140F of FIG. 1 is formed at the same time that a multilevel wiring 100 with, for example, four levels is formed, and has a similar structure as that of a part of the multilevel wiring. The fuse element 140F includes, for example, a fuse wiring 145F formed at the top level (a fourth level) of the multilevel wiring, another fuse wiring 135F just under the top level (a third level), at least one fuse via plug 143F acting as a fuse element connecting fuse wirings in the third and fourth levels, and a laser beam irradiation opening 150F made in insulators 148, 149 on the fuse wiring 145F so as to correspond to the fuse via plug 143F. The fuse via plug 143F is characterized by having a smaller cross-section than that of another via plug 143 connecting the wirings formed in the same level.

Figure 2:
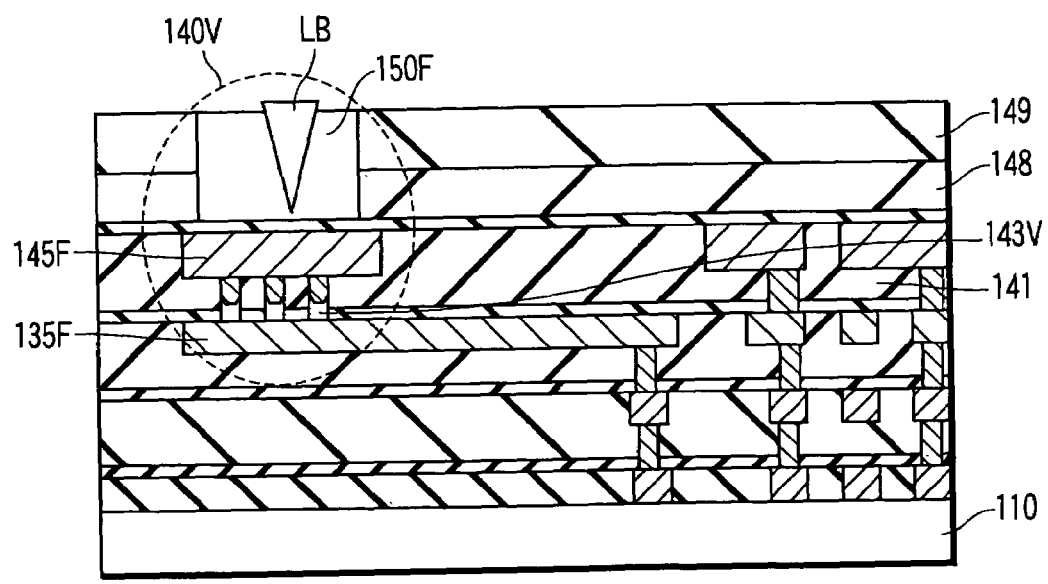
FIG. 2 is a sectional view of a semiconductor device according to the first embodiment, particularly a sectional view of a fuse element with a void.

The fuse element 140V of FIG. 2 is characterized by having a void 143V in the fuse via plug 143F shown in the structure 140F of FIG. 1. The void 143V in the via plug is formed as follows: the fuse wiring 145F is irradiated by the laser beam LB inducing thermal stress, with the result that at least a part of a metal (e.g., Cu) consisting the via plug migrates by the induced stress, producing a void.

Hereinafter, a method of manufacturing the fuse element 140F will be explained by reference to the sectional views shown in FIGS. 3 to 6. As in FIG. 1, the device structure formed in the semiconductor (e.g., silicon) substrate is omitted and regarded as being included in the silicon substrate 110. As an example, a multilevel wiring with four levels is shown focusing on the multilevel wiring part related to the present invention.

Figure 3:
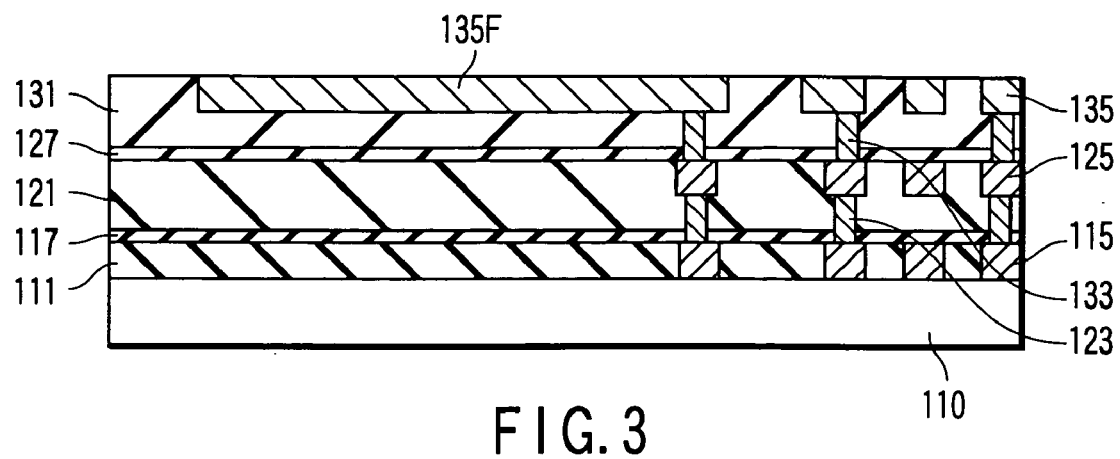
FIG. 3 is a sectional view to help explain a semiconductor device manufacturing process in the first embodiment.

FIG. 3 shows a case where up to a third wiring level 135 has been formed by damascene and dual damascene processes on the silicon substrate 110 in which MOSFETs, memory capacitors, and others have been formed. Hereinafter, the manufacturing processes will be explained in sequence.

(1) First, a first wiring is formed by a damascene process. Specifically, a first inter-wiring insulator 111 composed of a low-permittivity insulator is formed on the entire surface of the silicon substrate. It is desirable that the low-permittivity insulator should have a lower relative permittivity than that of the silicon oxide film. More preferably, its relative permittivity is 3 or less. For example, such a low-permittivity insulator as a fluorine-added silicon oxide film, methyl-polysiloxane (MSX), hydrogen-silsesquioxane (HSQ), or poly (arylene) ether (PAE) may be used.

Next, a wiring groove is made in the first inter-wiring insulator 111 by lithography and etching. Wiring metal is deposited over a barrier metal (not shown) preventing the diffusion of wiring material so as to fill in the wiring groove. As the barrier metal, for example, tantalum (Ta), titanium nitride (TiN), tantalum nitride (TaN), or a stacked layer of these can be used. While Cu is used as the wiring metal in the embodiment, another metal, such as Al, or an alloy containing these metals may be used.

Thereafter, the Cu formed on the first inter-wiring insulator 111 excluding the wiring groove is removed and planarized by chemical mechanical planarization (CMP). In this way, a first Cu wiring 115 is formed. Then, a first barrier insulator 117 to prevent the diffusion of Cu is formed on the entire surface. While in the first embodiment, silicon nitride (SiN) is used for the barrier insulator, another film may be used, provided that it has the capability of preventing the diffusion of Cu.

(2) Next, a first via plug 123 and a second Cu wiring 125 which is to be formed above the first Cu wiring 115 are formed by a dual damascene process. The first via plug 123 connects the first Cu wiring 115 and the second Cu wiring 125. Specifically, a second interlevel insulator 121 composed of a low-permittivity insulator is formed on the entire surface. It is desirable that the second interlevel insulator 121 should have a relative permittivity of 3 or less as the first inter-wiring insulator 111 does. A low-permittivity insulator made of the same material as that of the first inter-wiring insulator 111 or a low-permittivity insulator made of a different material may be used as the second interlevel insulator 121.

Then, a first via hole to connect the first Cu wiring 115 and the second Cu wiring 125 to be formed above the first Cu wiring is made by lithography and etching. Next, a second wiring groove is made. To fill in the first via hole and the second wiring groove, Cu for a second wiring is deposited over a barrier metal (not shown).

Thereafter, the Cu formed on the second interlevel insulator 121 excluding the wiring groove is removed and planarized by CMP. In this way, the first via plug 123 and second Cu wiring 125 are formed. Then, a second barrier insulator 127 is formed on the entire surface.

(3) Similarly, a second via plug 133 and a third Cu wiring 135 are formed by repeating the processes explained in step (2). In a part of the third Cu wiring 135, there is provided an extended Cu wiring, i.e. a fuse wiring 135F, to form a fuse element thereon. In this way, the structure of FIG. 3 is formed.

Figure 4:
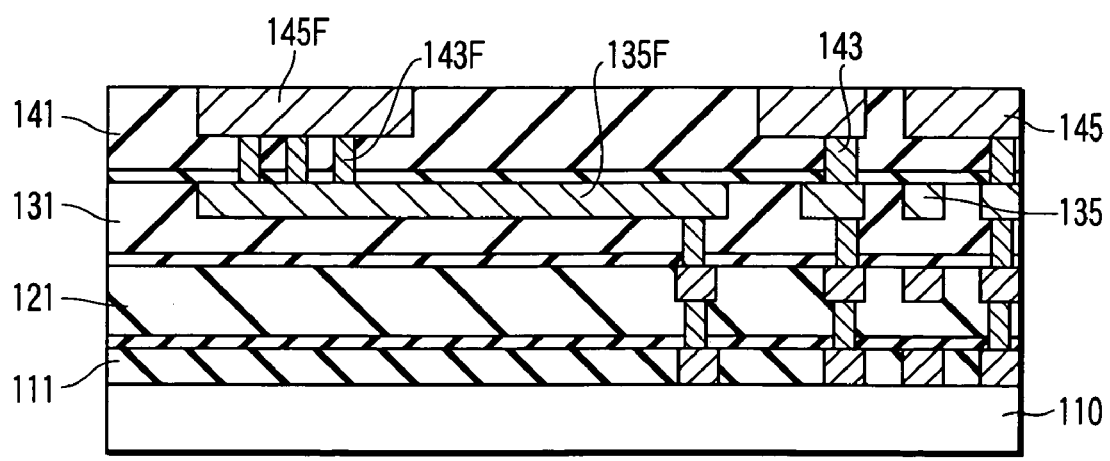
FIG. 4 is a sectional view to help explain a semiconductor device manufacturing process following FIG. 3.

(4) Next, a third barrier insulator 137 is formed on the entire surface. By the same process as the preceding step (2), a third via plug 143 and a fourth Cu wiring 145 are formed in a fourth interlevel insulator 141 as shown in FIG. 4. At the same time, the fuse wiring 145F and the fuse via plug 143F serving as a fuse element are formed. The fuse via plug 143F connects the fuse wiring 145F and the extended Cu wiring in the third wiring level, the fuse wiring 135F, below the fuse wiring 145F. In the first embodiment, for a reason explained later, it is desirable that the diameter of the fuse via plug 143F acting as a fuse element should be made smaller in the diameter than that of the via plug 143 connecting the wirings 135, 145 formed in the same level. For example, the diameter of the via plug 143 connecting the wirings 134, 145 may be designed to 0.6 μm and the diameter of the fuse via plug 143F may be designed to 0.25 μm. The number of via plug as a fuse element may be one per fuse element or more than one per fuse element.

Figure 5:
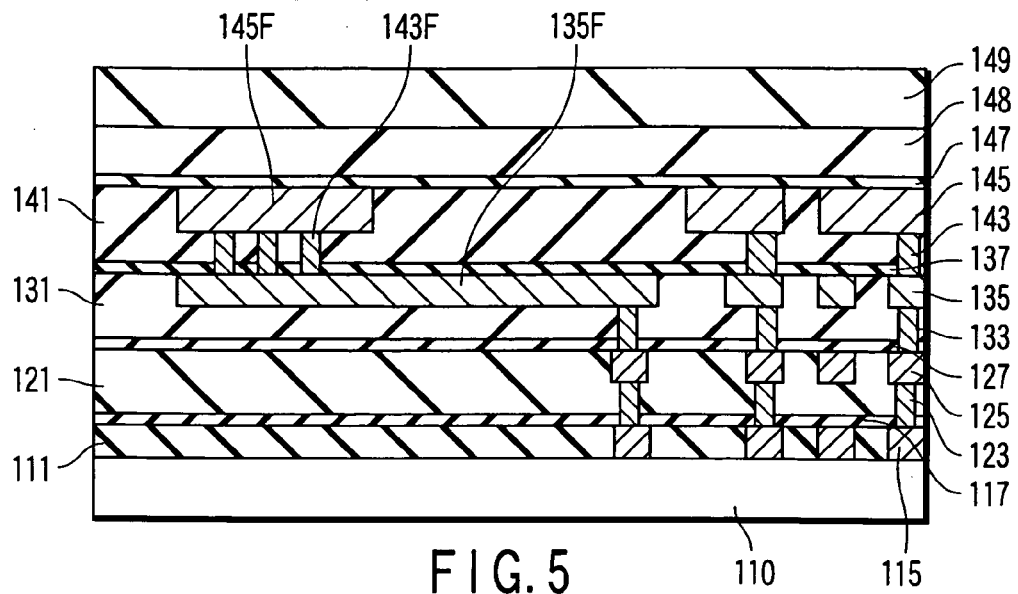
FIG. 5 is a sectional view to help explain a semiconductor device manufacturing process following FIG. 4.

(5) Thereafter, as shown in FIG. 5, an SiN film is formed on the entire surface as a fourth barrier insulator 147 to prevent the diffusion of Cu. On the SiN film 147, an $SiO_2$ film 148 and an SiN film 149 are formed as passivation insulators.

Figure 6:
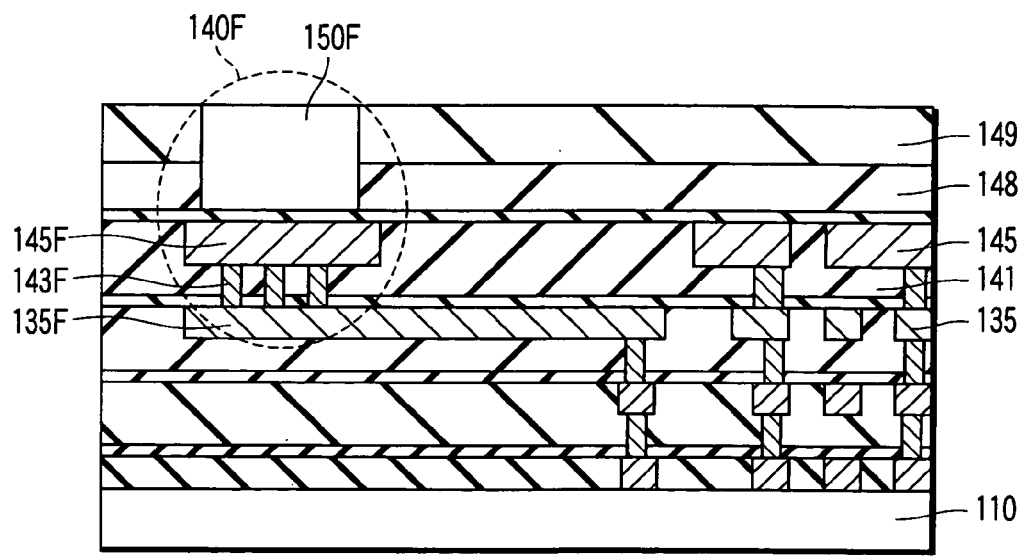
FIG. 6 is a sectional view to help explain a semiconductor device manufacturing process following FIG. 5.

(6) Finally, the opening 150F for the laser beam LB irradiation is made by lithography and etching in the passivation insulators 148, 149 corresponding to the fuse via plug 143F, which completes a fuse element 140F shown in FIG. 6. As a result, a semiconductor device including the fuse element 140F according to the first embodiment, such as a DRAM or a memory-embedded logic device, is completed.

Next, a method for performing on/off control of the fuse element 140F will be explained. A semi-conductor device manufactured as described above is measured electrically to determine fuse elements to be turned off. In the first embodiment, the laser beam LB is irradiated onto the fuse elements to increase their resistance by 100 times or more, thereby turning off the fuse elements. In the prior art, the operation of turning off a fuse element is achieved by fusing off the fuse wiring by, for example, the laser beam irradiation. In the method for fusing off the fuse wiring, such a problem as an increase in the leakage current or the degradation of the reliability has arisen as a result of using a low-heat-resistance, low-permittivity insulator as the interlevel insulator.

Therefore, the first embodiment is characterized by irradiating the laser beam LB without fusing off the fuse wiring 145F.

Specifically, instead of fusing off the fuse wiring 145F by the laser beam LB irradiation, the fuse wiring 145F and the fuse via plug 143F acting as a fuse element are heated locally by the laser beam LB. The thermal stress developed at this time makes Cu atoms in the fuse via plug 143F to cause a stress migration. As a result, a void 143V as shown in FIG. 2 is formed in the fuse via plug 143F. If the resistance of the fuse element 140F is increased by 100 times or more, the void 143V may be formed either only in a part of the cross section of the fuse via plug 143F or the entire cross section. This causes the resistance of the fuse element with the void 140V to increase to the value 100 times or more larger than that of the fuse element without a void 140F, which enables the fuse element 140V to be off in terms of circuit operation.

It is desirable that the condition for the laser beam LB irradiation should be set so that the temperature of the fuse Cu fuse wiring 145F irradiated by the laser beam LB should not exceed the melting point (1083° C.) of Cu. At the same time, it is desirable that the interlevel insulator 141 in contact with the fuse Cu fuse wiring 145F and fuse via plug 143F should not be heated to be degraded or deformed. When an amorphous (glass) interlevel insulator is heated higher than its softening temperature, the insulator might be deformed or decomposed, leading to a deformation or cracking in the insulator. As a result, a short or an open circuit develops in circuits around the fuse element, causing a failure in the semiconductor device. When a low-permittivity film whose permittivity is lower than that of $SiO_2$ is used as the interlevel insulator, since its softening temperature is low, it is desirable that the heating temperature should be 500° C. or less for an organic film and 600° C. or less for an organic silicon oxide film (SiOC film). The lower limit temperature in laser irradiation is preferably at a temperature equal to or higher than 250° C. at which stress migration takes place quickly and reliably, more preferably at 300° C. or higher. The reason is that the migration of Cu atoms is in a heat-activated process and increases in the migration speed as the temperature rises.

A mechanism of the formation of the void 143V in the fuse via plug 143F will be explained briefly. It is known that, when a large stress is applied to Cu constituting the wiring and via plug, Cu atoms cause a stress migration due to the stress and therefore move. Under tensile stress, it is known that the stress migration is particularly noticeable. The laser beam LB is irradiated onto the fuse element 140F, with the result that the Cu fuse wiring 145F and fuse via plug 143F in the fuse element 140F are heated and expand. On the other hand, since the insulators around the fuse element, including the interlevel insulator 141, have a lower thermal conductivity than that of Cu, a rise in the temperature is smaller. Furthermore, since the thermal expansion coefficient of the insulator is generally smaller than that of Cu, the volume expansion of the insulators around the Cu fuse wiring 145F and fuse via plug 143F is smaller than that of each of the Cu fuse wiring 145F and fuse via plug 143F. Therefore, the Cu fuse wiring 145F and fuse via plug 143F undergo compressive stress. The compressive stress becomes larger in the fuse via plug 143F surrounded by the insulator 141 than the Cu fuse wiring 145F. When the laser beam irradiation is completed, the fuse element 140F starts to cool. Since the Cu fuse wiring 145F and fuse via plug 143F cool faster than the surrounding insulator, the Cu fuse wiring 145F and fuse via plug 143F undergo tensile stress in the cooling process.

Reverse of the heating described above, the tensile stress is larger at the fuse via plug 143F than at the Cu fuse wiring 145F, with the result that a stress gradient occurs there. As the fuse via plug 143F is covered with a barrier metal on the side and at the bottom, where the fuse via plug 143F is connected with the lower level Cu fuse wiring 135F, Cu cannot migrate to the lower level Cu wiring 135F. As a result, the stress gradient between the fuse via plug 143F and the upper level Cu fuse wiring 145F serves as a driving force, with the result that Cu atoms in the fuse via plug 143F cause a stress migration to the upper level Cu fuse wiring 145F, thus making a void 143V in the fuse via plug 143F. Since the void 143V in the fuse via plug 143F is apt to occur in the interface between the Cu and the barrier metal, the void 143 frequently occurs at the lower end of the via plug. It is desirable that the size of the void 143V need not be as large as the cross section of the fuse via plug 143F and cut off it completely as far as the resistance of the fuse via plug 143F can be made about 100 times or more.

Figure 7:
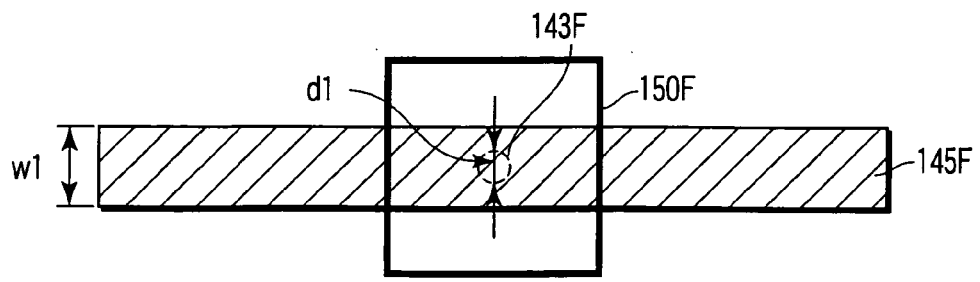
FIG. 7 is an illustration to help explain the relationship between the fuse wiring width and the diameter of a fuse via plug in the semiconductor device of the first embodiment.

To make an efficient migration of Cu atoms in the fuse via plug 143F, as shown in FIG. 7, there is a favorable relationship between the width of the fuse wiring 145F, w1, and the diameter of the fuse via plug 143F, d1, acting as a fuse element. Generally, the grater the w1/d1 ratio, the more the stress concentrates on the fuse via plug 143F and therefore the stress migration enhances. The result of an operation test on devices with the fuse element 140F has shown that the w1/d1 ratio is preferably 3 and more, and more preferably 10 and more. In the first embodiment, as described above, the diameter d1 of the fuse via plug 143F is made smaller than that of another via plug 143 in the same wiring level, thereby making the w1/d1 ratio larger. To make the w1/d1 ratio larger, the width of the fuse wiring 145F, w1, may be made larger. In addition, it is desirable that the upper limit of the w1/d1 ratio should be 100 or less, taking into account restrictions on lithography in a micro-fabrication of via plugs, restrictions on the device area in the increased wiring width, the reliability of the semiconductor device, and so forth.

Second Embodiment

Figure 8:
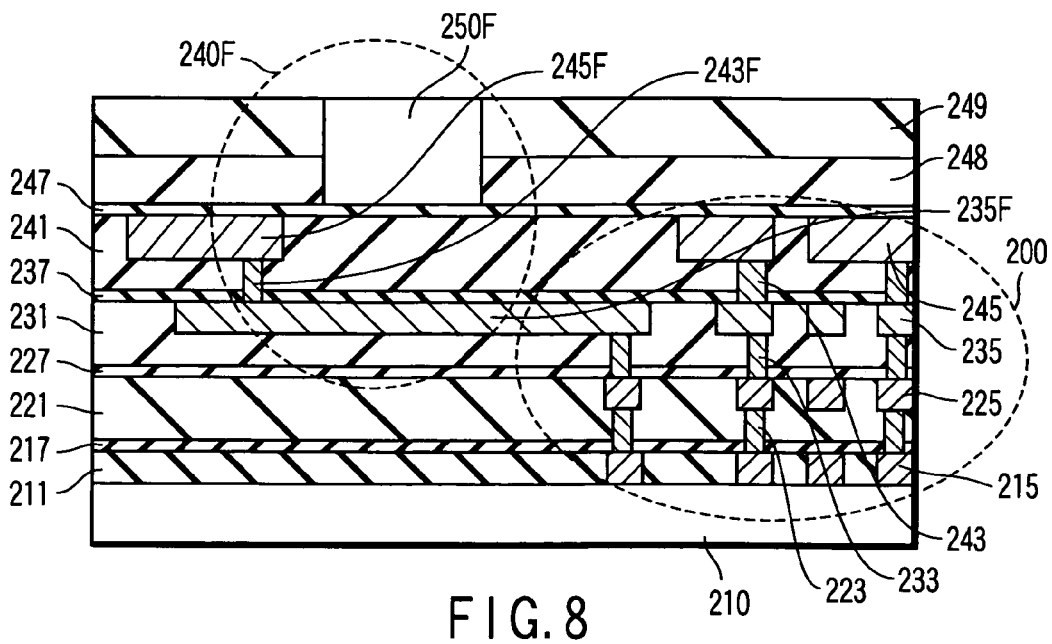
FIG. 8 is a sectional view of a semiconductor device according to a second embodiment of the present invention, particularly a sectional view of a fuse element without a void.

FIG. 8 is a sectional view of an example of the structure of a semiconductor device according to a second embodiment of the present invention. FIG. 8 mainly shows the part related to a fuse element with a multilevel wiring structure associated with the present invention as in the first embodiment. The basic structure of the fuse element 240F is the same as that of the first embodiment, except that the place where an opening 250F for the laser beam LB irradiation is made and the place where a void 235V is formed in the fuse element are different from those in the first embodiment.

The fuse element structure of the second embodiment has two different elements, i.e. a fuse element 240V with a void 235V (see FIG. 9) and a fuse element 240F without a void (see FIG. 8). The void 235V is formed in a fuse wiring 235F at a connection of a fuse via plug 243F and a fuse wiring 235F of the fuse element 240V.

The fuse element 240F of FIG. 8 is formed, for example, at the same time that a multilevel wiring 200 with, for example, four levels is formed, and has a similar structure as a part of the multilevel wiring 200. The fuse element 240F includes a fuse wiring 245F formed at the top level (a fourth level) of the multilevel wiring, a lower level fuse wiring 235F (a third level) under the fuse wiring 245F, at least one fuse via plug 243F connecting the fuse wirings 245F, 235F, and a laser beam irradiation opening 250F made in parts of the insulators 248, 249 deposited above the fuse wiring 245F and adjacent to the fuse via plug 243F. It is desirable that the fuse via plug 243F should have a smaller cross section than that of another via plug 243 connecting the wirings 245 and 235 formed in the same level.

Figure 9:
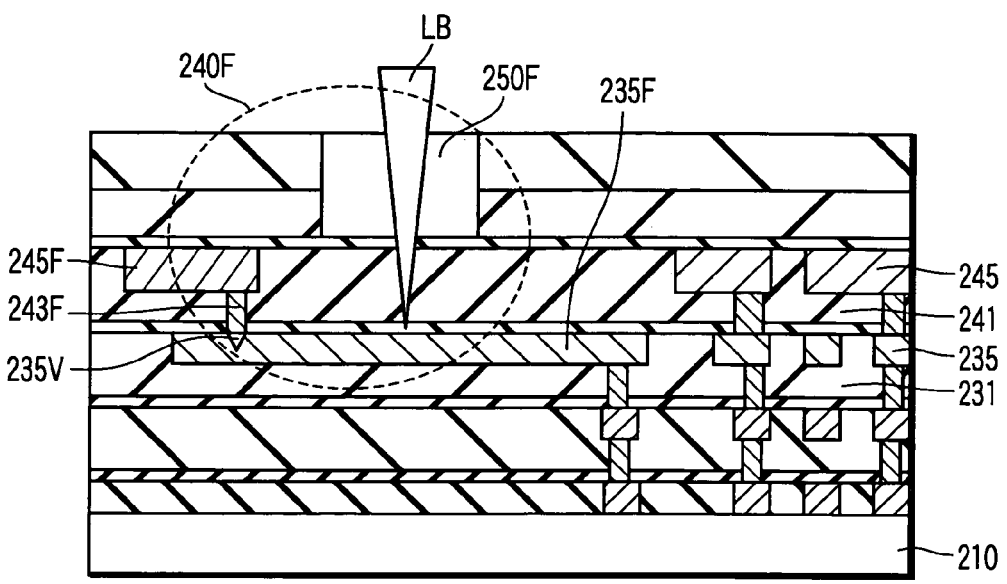
FIG. 9 is a sectional view of a semiconductor device according to the second embodiment, particularly a sectional view of a fuse element with a void.

The fuse element 240V with a void shown in FIG. 9 is characterized by having the void 235V in the lower level fuse wiring 235F at the connection of the lower level fuse wiring 235F and the fuse via plug 243F as described above. The void 235V is made as follows: the laser beam LB is irradiated onto the lower level fuse wiring 235F, causing stress to concentrate at the connection of the fuse wiring 235F and the fuse via plug 243F, with the result that Cu atoms in the fuse wiring 235F migrate away from the connection, thereby producing a void.

A method of manufacturing the fuse element 240F is almost the same as the fuse element manufacturing method-in-the-first embodiment explained by reference to FIGS. 3 to 6, except for the place where the opening 250F for the laser beam LB irradiation is made in the insulators 248, 249 formed above the top wiring. In the first embodiment, the opening 150F is made above the upper level fuse wiring 145F connected to the fuse via plug 143F so as to correspond to the fuse via plug 143F serving as a fuse element. In the second embodiment, however, the opening 250F is made above the lower level fuse wiring 235F adjoining the fuse via plug 243F as shown in FIG. 5. In this way, the fuse element 240F with the opening 250F for the laser beam LB irradiation can be formed above the lower level fuse wiring 235F adjoining the fuse via plug 243F for a fuse. The number of via plug for fuse may be one per fuse element or more than one per fuse element. The distance between the center of the opening 250F for the laser beam LB irradiation and the center of the nearest fuse via plug 243F is preferably 10 μm or less, and more preferably 5 μm or less.

In this way, a semiconductor device including the fuse element 240F according to the second embodiment, such as a DRAM or a memory-embedded logic device, is completed.

Next, a method of performing on/off control of the fuse element 240F will be explained. A semiconductor device manufactured as described above is measured electrically to determine fuse elements to be turned off. In the second embodiment, the fuse element 240F is turned off by the laser beam LB irradiation onto the fuse element 240F to increase its resistance by 100 times or more. The laser beam LB is irradiated onto the fuse elements 240F to be turned off, thereby forming fuse elements 240V with the void 235V in the fuse wirings 235F at the connections of fuse wiring 235F and the fuse via plugs 243F. This causes the resistance of the fuse elements 240V to be increased by 100 times or more, thereby turning off the fuse elements. The present invention is characterized that the laser beam is irradiated without fusing off the fuse element 240F. Therefore, the problem arising from the fusing off the fuse wiring in the prior art can be avoided.

Here, a mechanism for the formation of the void 235V in the fuse element 240F in the second embodiment, that is, a stress migration of Cu atoms, will be explained briefly. When the lower level fuse wiring 235F is heated locally by the laser beam LB irradiation, the fuse wiring 235F is expanded thermally. The amount of thermal expansion is grater in the longitudinal direction of the wiring. Since the fuse wiring 235F is connected to the fuse via plug 243F, it is fixed there. Accordingly, stress concentrates at the connection, with the result that tensile stress is generated in the fuse-wiring 235 at the farther end of the connection from the position where the laser beam LB is irradiated. In cooling, tensile stress is generated in the closer end of the connection to the position where the laser beam LB is irradiated. Under the tensile stress, Cu atoms at the connection with the fuse via plug 243F are going to make a stress migration. Since the fuse wiring 235F is connected to the fuse via plug 243F through a barrier metal, Cu atoms migrate within the fuse wiring 235F. Therefore, the migration is started at the connection with the fuse via plug 243F then the void 235V is formed in the lower level fuse wiring 235F. As a result, at the connection of the fuse wiring 235F and the fuse via plug 243F, the resistance of the connection increases by 100 times or more, which enables the fuse element 240F to be turned off in terms of circuit operation. It is desirable that the size of the void 235V need not be as large as the cross section of the connection of the fuse wiring 235F and the fuse via plug 243F and cut it off completely as far as the resistance of the fuse element 240F can be made about 100 times or more larger than that of the fuse element 240F without a void.

Figure 10:
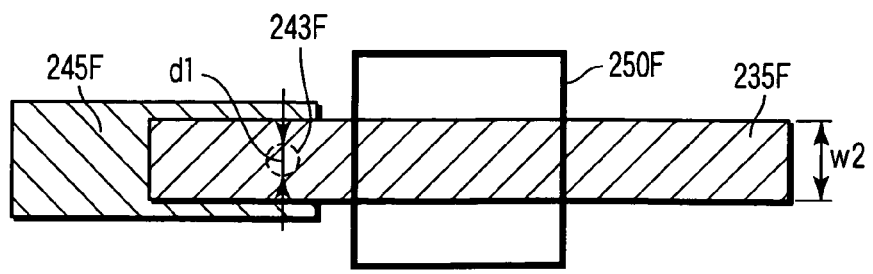
FIG. 10 is an illustration to help explain the relationship between the fuse wiring width and the diameter of a fuse via plug in the semiconductor device of the second embodiment.
Figure 11:
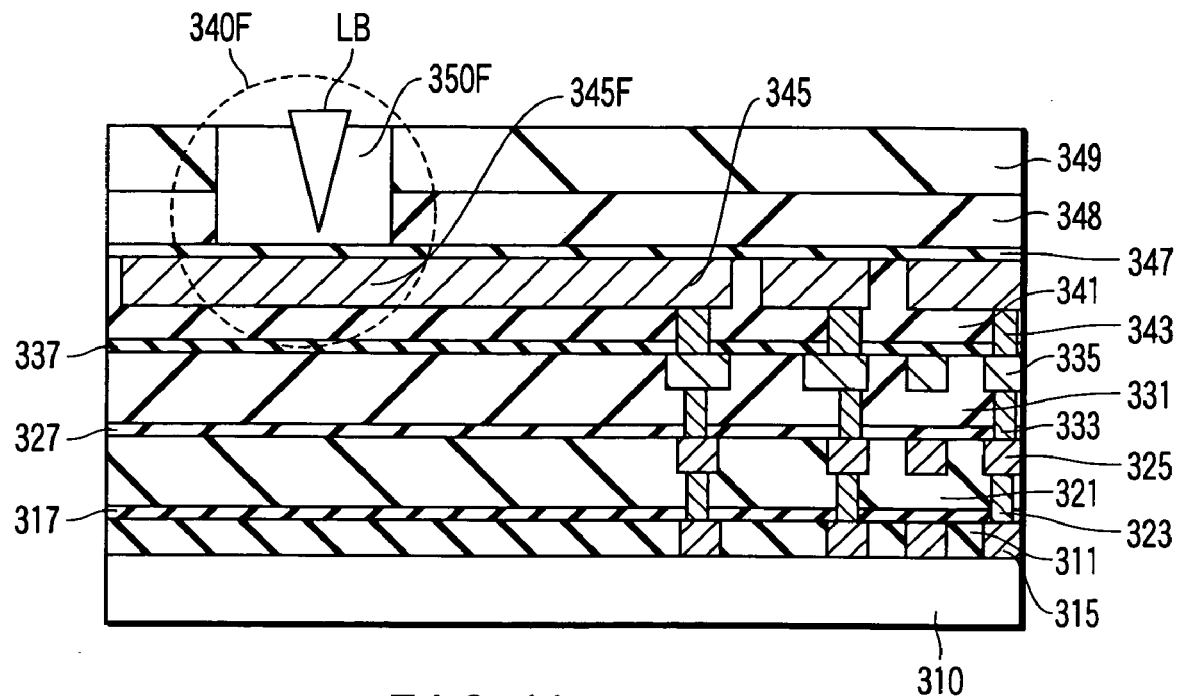
FIG. 11 is a sectional view of a semiconductor device in the prior art.
Figure 12:
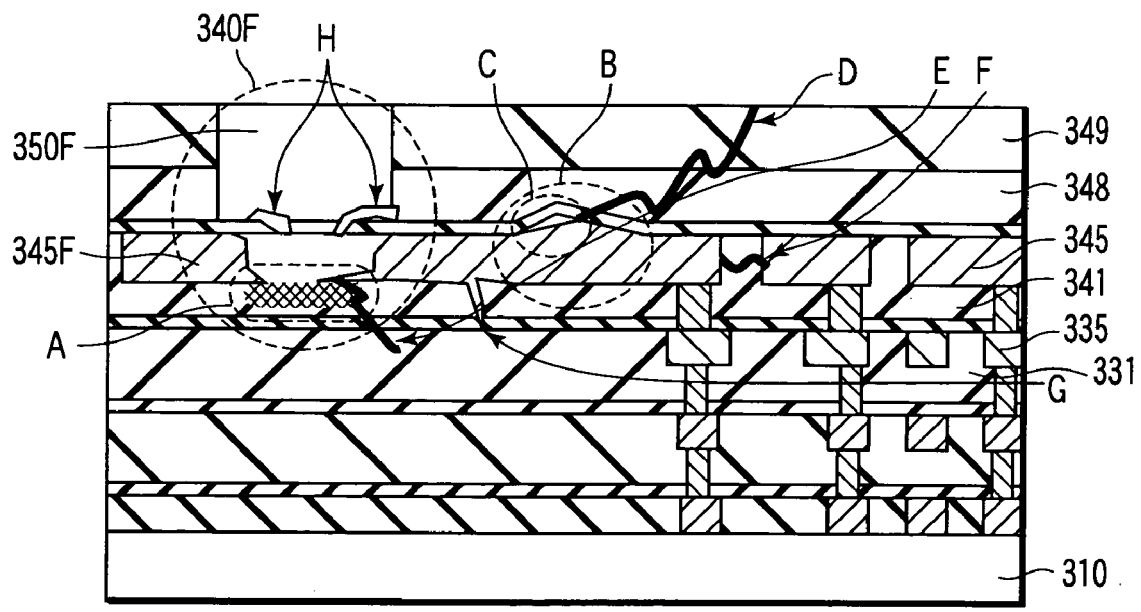
FIG. 12 is a sectional view to help explain problems arising from the fusing off the fuse wirings by a laser beam irradiation in a semiconductor device in the prior art.

To make an efficient stress migration of Cu atoms in the fuse wiring 235F, there is a favorable relationship between the width of the fuse wiring 235F, w2, and the diameter of the fuse via plug 243F, d1, as shown in FIG. 10. Generally, the grater the w2/d1 ratio, the more the stress concentrates in the fuse wiring 235F at the connection, and therefore the stress migration enhances. The result of an operation test of a device with the fuse element 240F has shown that the w2/d1 ratio is preferably 3 or more, and more preferably 10 or more. In the second embodiment, the diameter d1 of the fuse via plug 243F is made smaller than that of another via plug 243 in the same wiring level, thereby making the w2/d1 ratio larger. For example, the diameter d1 of the fuse via plug 243F is 0.25 µm and the diameter of the via plug 243 of another part is 0.6 µm. Alternatively, to make the w2/d1 ratio larger, the width w2 of the fuse wiring 235F may be made larger. In addition, it is desirable that the upper limit of the w2/d1 ratio should be 100 or less, taking into account restrictions on lithography in a micro-fabrication of via plugs, restrictions on the element area in increasing the wiring width, the reliability of the semiconductor device, and so forth.

Furthermore, as in the first embodiment, it is desirable that the condition for the laser beam LB irradiation should be that the temperature of the fuse Cu wiring 235F irradiated by the laser beam LB does not exceed the melting point (1083° C.) of Cu and that the interlevel insulators 231, 241 in contact with the fuse Cu wiring 235F heated are prevented from deterioration and deformation.

While in the second embodiment, Cu has been used as the wiring material, a Cu alloy, another metal, such as Al, or an alloy containing the metal, may be used as the wiring material. When Al is used as the wiring material, a similar effect is produced, since Al is easy to cause a stress migration like Cu.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate;
   a plurality of first wirings formed above the semiconductor substrate;
   a plurality of second wirings formed above the first wirings;
   a plurality of fuse plugs, each of the fuse plugs connecting one of the first wirings and one of the second wirings;
   an insulator formed above the second wirings; and
   an opening made in a part of the insulator above the fuse plugs,
   wherein the device includes at least one first fuse plug with a void and at least one second fuse plug without a void.

2. The semiconductor device according to claim 1, wherein the first wirings, the second wirings, and the fuse plugs are made of a metal material containing copper.

3. The semiconductor device according to claim 1, wherein the void is formed in the first fuse plug by a laser beam irradiation onto the opening.

4. The semiconductor device according to claim 3, wherein the second wirings are not fused.

5. The semiconductor device according to claim 3, wherein an electric resistance of the first fuse plug is increased by the void formed in the first fuse plug.

6. The semiconductor device according to claim 3, wherein a ratio of a width of the second wirings to a diameter of the fuse plugs is 3 or more and 100 or less.

7. A semiconductor device, comprising:
   a semiconductor substrate;
   a plurality of lower wirings formed above the semiconductor substrate;
   a plurality of upper wirings formed above the lower wirings;
   a plurality of fuse plugs, connecting one of the lower wirings and one of the upper wirings;
   an insulator formed above the upper wirings; and
   an opening which is made in a part of the insulator above the lower wirings adjoining the fuse plugs,
   wherein the device includes at least one first lower wiring with a void at a connecting portion of the first lower wiring and a fuse plug and at least one second lower wiring without a void.

8. The semiconductor device according to claim 7, wherein the lower wirings, the upper wirings, and the fuse plugs are made of a metal material containing copper.

9. The semiconductor device according to claim 7, wherein the void is formed in the first lower wiring by a laser beam irradiation onto the opening.

10. The semiconductor device according to claim 7, wherein the lower wirings are not fused.

11. The semiconductor device according to claim 7, wherein an electric resistance of the connection of the first lower wiring and the fuse plug is increased by the void formed in the first lower wiring.

12. The semiconductor device according to claim 7, wherein a ratio of a width of the lower wirings to a diameter of the fuse plugs is 3 or more and 100 or less.

13. The semiconductor device according to claim 1, further comprising;
   a plurality of via plugs, each of the via plugs connecting one of the first wirings and one of the second wirings and having a larger diameter than that of the fuse plugs.

14. The semiconductor device according to claim 7, further comprising;
   a plurality of via plugs, each of the via plugs connecting one of the lower wirings and one of the upper wirings and having a larger diameter than that of the fuse plugs.

* * * * *